(12) United States Patent
Wicpalek et al.

(10) Patent No.: US 7,592,874 B2
(45) Date of Patent: Sep. 22, 2009

(54) PHASE/FREQUENCY DETECTOR, PHASE LOCKED LOOP, METHOD FOR PHASE/FREQUENCY DETECTION AND METHOD FOR GENERATING AN OSCILLATOR SIGNAL

(75) Inventors: Christian Wicpalek, Linz (AT); Thomas Mayer, Linz (AT); Linus Maurer, Linz (AT); Volker Neubauer, Linz (AT); Thomas Bauernfeind, Arbing (AT)

(73) Assignee: Infineon Technologies AG, Neubiberg (DE)

( * ) Notice: Subject to any disclaimer, the term of this patent is extended or adjusted under 35 U.S.C. 154(b) by 49 days.

(21) Appl. No.: 11/925,539

(22) Filed: Oct. 26, 2007

(65) Prior Publication Data

US 2008/0100386 A1 May 1, 2008

(30) Foreign Application Priority Data

Oct. 27, 2006 (DE) .................. 10 2006 050 881

(51) Int. Cl.
*H03D 13/00* (2006.01)
*H03L 7/085* (2006.01)
(52) U.S. Cl. .................. 331/25; 331/1 A; 331/16; 331/18; 327/12; 327/156; 455/260
(58) Field of Classification Search ............ 331/1 A, 331/16, 18, 26; 327/2, 3, 12, 156–159; 375/376; 455/260
See application file for complete search history.

(56) References Cited

U.S. PATENT DOCUMENTS

| 3,555,446 | A | * | 1/1971 | Braymer ................ 331/16 |
| 4,458,214 | A | * | 7/1984 | Lakomy ................ 331/1 A |
| 6,219,394 | B1 | | 4/2001 | Sander |
| 6,326,851 | B1 | | 12/2001 | Staszewski et al. |
| 6,362,769 | B1 | | 3/2002 | Hovin et al. |
| 6,429,693 | B1 | | 8/2002 | Staszewski et al. |
| 6,734,741 | B2 | | 5/2004 | Staszewski et al. |
| 6,809,598 | B1 | | 10/2004 | Staszewski et al. |
| 2002/0168043 | A1 | | 11/2002 | Sander |
| 2008/0075152 | A1 | * | 3/2008 | Melanson ................ 375/216 |

OTHER PUBLICATIONS

"A Fast-Frequency-Switching PLL Synthesizer LSI with a Numerical Phase Comparator", Masaru Kokubo, Kazuyuki Hori, Takayasu Ito, Yuichi Tazaki and Nobuyuki, Takei, ISSCC95/Session 15/Frequency Synthesizers/Paper FA 15.2, IEEE International Solid-State Circuits Conference, 1995, 3 pgs.

(Continued)

*Primary Examiner*—David Mis
(74) *Attorney, Agent, or Firm*—Eschweiler & Associates, LLC

(57) ABSTRACT

A phase/frequency detector has a modulo counter for outputting a counter word with a predetermined word length depending on an oscillator signal. In addition, a modulo integrator for outputting an integrator word with the predetermined word length as a function of integration of a channel word is provided. The phase/frequency detector also has a difference element for outputting a phase error word with the predetermined word length as a function of a difference between the counter word and the integrator word.

25 Claims, 6 Drawing Sheets

OTHER PUBLICATIONS

"The First Fully Integrated Quad-Band GSM/GPRS Receiver in a 90-nm digital CMOS Process", Khurram Muhammad, Yo-Chuol Ho, Terry L. Mayhugh, Jr., Chih-Ming Hung, T. Jung, Imtinan Elahi, Charles Lin, Irene Deng, C. Fernando, John L. Wallberg, Sudheer K. Vemulapalli, S. Larson, Thomas Murphy, Dirk Leipold, Patrick Cruise, J. Jaehnig, Meng-Chang Lee, Robert Bodgan, Roman Staszewski and Ken Maggio, IEEE Journal of Solid-State Circuits, vol. 41, No. 8, Aug. 2006, pp. 1772-1783.

Best, Roland, "Theory and Applications of the Phase-locked loop with floppy disks for PLL simulation" (translation from German language document entitled "Theorie und Anwendungen des Phase-Locked-Loops"), AT Verlag, p. 1-18, 1982.

* cited by examiner

PHASE/FREQUENCY DETECTOR, PHASE LOCKED LOOP, METHOD FOR PHASE/FREQUENCY DETECTION AND METHOD FOR GENERATING AN OSCILLATOR SIGNAL

REFERENCE TO RELATED APPLICATIONS

This application claims the benefit of the priority date of German application DE 10 2006 050 881.5, filed on Oct. 27, 2006, the contents of which are herein incorporated by reference in their entirety.

FIELD OF THE INVENTION

The invention relates to a phase/frequency detector and to a phase locked loop comprising the phase/frequency detector. The invention also relates to a method for phase/frequency detection, to a method for generating an oscillator signal and to a use for a phase/frequency detector.

BACKGROUND OF THE INVENTION

Mobile radio systems today use various mobile radio standards such as the Global System for Mobile communication (GSM), Enhanced Data Rates for GSM Evolution (EDGE), Universal Mobile Telecommunications Standard (UMTS), or others. In this case, radio-frequency signals are used for transmission. Other systems also use radio-frequency signals for data transmission.

To generate and receive the radio-frequency transmission/reception signals, use is increasingly being made of digitally controlled oscillators, DCOs. As its output signal, a DCO generates a radio-frequency signal on the basis of a digital frequency word. In addition, a digital phase locked loop with a DCO on a semiconductor body requires less space than a corresponding phase locked loop with an analogue-controlled voltage controlled oscillator, VCO. A digitally implemented phase locked loop for frequency synthesis or signal modulation can also be transferred to a next semiconductor process generation more easily.

A digital phase locked loop usually comprises a digitally controlled oscillator for generating an oscillator signal. The oscillator signal is fed back to a comparator directly or via a frequency divider, which may have an adjustable divider ratio. In this case, the comparator usually has a second input for supplying a reference frequency signal. The output of the comparator outputs a digital error word which is usually supplied to a control input of the digitally controlled oscillator via a digital loop filter.

The comparator may be in the form of a phase detector, in the form of a frequency detector or in the form of a combined phase/frequency detector. In the case of fully digital phase locked loops, phase detection is an element which should not be ignored. The comparator delivers a digital word as a measure of a detected phase for the returned oscillator signal, which is compared with a nominal value, likewise in digital form. A nominal/actual value discrepancy is output to the control loop as a digital error word. It is desirable for the comparator to have a high level of accuracy and to be insensitive to external interference. In addition, a phase recognition area of the comparator needs to be designed such that discrepancies from the nominal signal can be compensated for within a predetermined framework. Such discrepancies can be caused by timing inaccuracies, such as timing jitter, in the reference frequency signal or by analogue phase noise on account of analogue components in the oscillator, for example.

By way of example, the comparator may be implemented as a frequency detector which is designed using a fully synchronous counter with a subsequent differentiator. However, a fully synchronous counter of this kind can be difficult to implement, particularly when the oscillator signal has high input frequencies. By way of example, a desired level of synchronism makes great demands on delayed properties of the components used. In addition, a frequency detector of this kind requires a high power consumption.

The use of a differentiator downstream of the counter in the frequency detector also prompts conversion of the phase information into frequency information, which should be converted back into phase information again in the loop filter using an integrator. This results in an increase in the complexity in the digital phase locked loop.

In another possible embodiment, the comparator comprises a counter, which is used as a phase detector for coarse quantization of the phase information in the oscillator signal, and a time/digital converter (time-to-digital converter), TDC. In this case, the TDC can be used for finer phase quantization. However, the additional TDC increases the complexity of the comparator or the phase locked loop in this case too.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

In one exemplary embodiment, a phase/frequency detector comprises a modulo counter which comprises an output which outputs a counter word with a predetermined word length depending on an oscillator signal. In addition, a modulo integrator is provided which outputs an integrator word with the predetermined word length at its output as a function of an integration of a channel word. The phase/frequency detector also comprises a difference element for generating a phase error word with the predetermined word length as a function of a difference between the counter word and the integrator word.

In one embodiment the modulo counter counts clock edges in an oscillator signal, supplied to the input, using a digital resolution which is prescribed by the predetermined word length, and outputs a current counter value, for example depending on a reference clock signal, at its output, as a counter word. As soon as the counter value reaches a value which corresponds to a modulo factor stipulated by the predetermined word length, the counter value is reset to zero, from where the counting operation is continued. The value of the counter word therefore cannot exceed the modulo factor.

In a similar manner, in one embodiment a respective modulo operation is performed in the modulo integrator with the integrated channel word, so that the value of the integrator word does not exceed the modulo factor either. The phase error word generated from the difference between the counter word and the integrator word should likewise be no greater than the modulo factor.

Since, in accordance with one embodiment, the phase/frequency detector does not contain a differentiator for generating the phase error word, it is possible to dispense with an integrator in a downstream loop filter when using the phase/frequency detector in a phase locked loop. Hence, both the phase/frequency detector and the phase locked loop with the phase/frequency detector can be implemented with little complexity.

In one exemplary embodiment of a method for phase/frequency detection, a counter word is generated depending on clock edges of an oscillator signal and a predetermined range value. Integration is used to derive from a channel word an integrator word which is used to perform a modulo operation as a function of the range value. A phase error word is derived by forming the difference between the counter word and the integrator word, with a modulo operation being performed as a function of the range value using the phase error word too.

The modulo operations or the dependency of the counter word on the range value make it possible to ensure that the counter word, the integrator word and the phase error word have the same range of values. By way of example, the oscillator signal can be generated depending on a control signal which is obtained by filtering the phase error word.

BRIEF DESCRIPTION OF THE DRAWINGS

The invention is explained in more detail below using a plurality of exemplary embodiments with reference to the figures, in which.

DETAILED DESCRIPTION OF THE INVENTION

Figure 1:
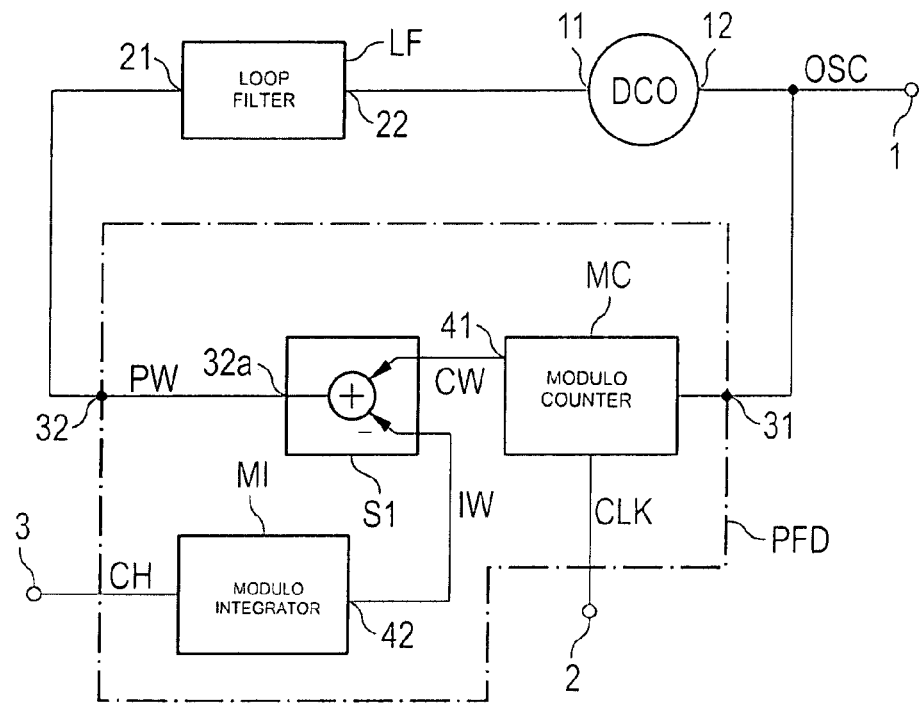
FIG. 1 shows a first exemplary embodiment of a phase locked loop.

The description below discloses further aspects and embodiments of the present invention. In addition, reference is made to the accompanying figures, which form part of the description and which use illustrations to show how the invention can be implemented in practical terms. The embodiments in the drawings represent a disclosure to allow better understanding of one or more aspects of the present invention. This description is not a comprehensive overview of the invention and also does not intend to the limit the features or key elements of the invention to one particular embodiment. Rather, the various elements, aspects and features which are disclosed in the exemplary embodiments can be combined in various ways by a specialist person in order to arrive at one or more advantages of the invention.

It would be possible both to use other embodiments and to make structural or logical changes without departing from the basic concept of the present invention. The elements in the drawings are not necessarily true to scale in comparison with one another. Elements which have the same function or action bear the same reference symbols in this context.

FIG. 1 shows an exemplary embodiment of a digital phase locked loop which comprises a digitally controlled oscillator DCO comprising an oscillator input 11 and an oscillator output 12 which is coupled to a signal output 1 of the phase locked loop for the purpose of outputting an oscillator signal OSC. In addition, a phase/frequency detector PFD has its input 31 connected to the oscillator output 12. An output 32 of the phase/frequency detector PFD is coupled to an input 21 of a loop filter LF, whose output is electrically connected to the oscillator input 11.

The phase/frequency detector PFD comprises a modulo counter MC whose input is coupled to the input 31 of the phase/frequency detector PFD. The modulo counter MC also comprises a reference clock input 2 which is used to supply a reference clock signal CLK.

The phase/frequency detector PFD also comprises a modulo integrator MI which comprises a data input 3 for supplying a channel word CH and also an integrator output 42. In addition, the phase/frequency detector PFD comprises a difference element S1 forming the difference between a counter word CW at the output 41 of the modulo counter MC and an integrator word IW at the integrator output 42. The difference element S1 outputs the difference result as a phase error word PW at its output 32a, which is coupled to the output 32 of the phase/frequency detector PFD.

The counter word CW, the integrator word IW and the phase error word PW have the same predetermined word length in one embodiment. The modulo counter MC counts the number of clock edges arriving from the oscillator signal OSC during a defined reference cycle, which is prescribed by the reference clock signal CLK. In this case, the modulo counter may explicitly or implicitly contain a modulo operation which comprises resetting a counter value when a particular value is exceeded, said value being dependent on the predetermined word length. By way of example, at a word length of 3 bits, the counter value is reset to the value 0 when a theoretical counter value of 8 is reached. An explicit modulo operation is performed, by way of example, when the counter value might reach theoretically higher values than the range value or the value of the modulo operator and the counter value is actively reset on the basis thereof. Alternatively, the modulo counter MC may be configured such that it is limited to the predetermined word length for the counter value, and an overflow in the range of values prescribed thereby prompts automatic reset of the counter value to the value zero.

Similarly, the range of values for the integrator word IW is also limited to the modulo integrator MI. The channel word CH is integrated for discrete times in the modulo integrator, for example likewise depending on the reference clock signal CLK. The integration causes the range of values prescribed by the word length to be regularly exceeded. In this case too, a modulo operation can be actively performed with the modulo factor or is obtained automatically as a result of an overflow in an integrator whose range of values is limited by the predetermined word length.

Hence, a range of values based on the predetermined word length may also be obtained for the phase error word PW generated by the difference element S1. Since the resulting digital value of the counter word CW is a measure of the oscillator phase, and the digital value of the integrator word is a nominal value for the oscillator phase, the difference formation in the difference element S1 corresponds to a phase comparison between an actual phase and a nominal phase. Accordingly, the phase error word PW is a phase difference or phase error which is supplied to the loop filter LF. In this case, a phase error may be either positive or negative, that is to say that the actual phase can lead or lag the nominal phase.

Figure 2:
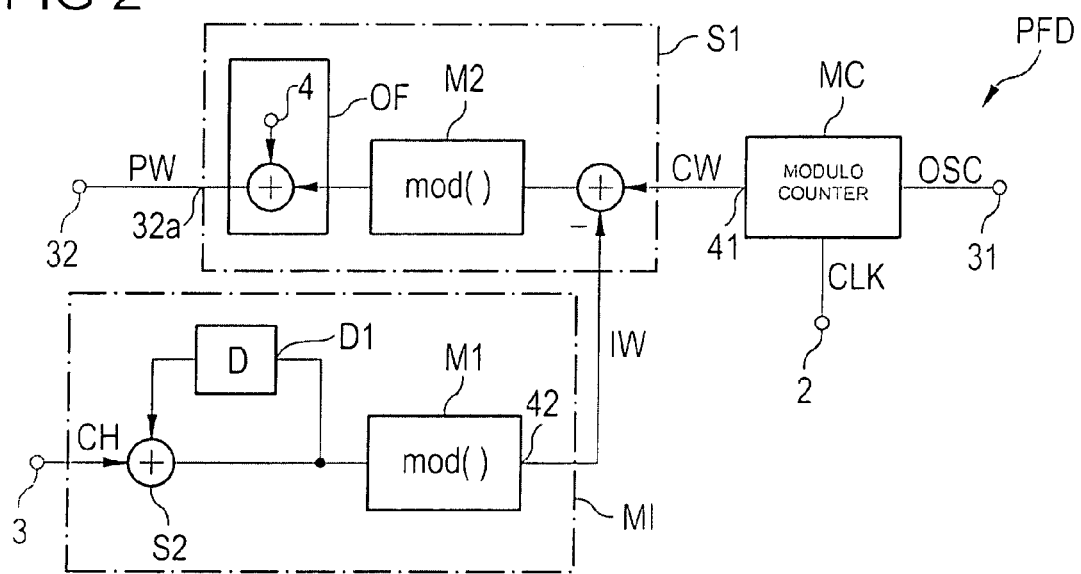
FIG. 2 shows an exemplary embodiment of a phase/frequency detector.

FIG. 2 shows an exemplary embodiment of a phase/frequency detector PFD which can be used in the embodiment of FIG. 1. In this case, the modulo integrator MI comprises a summator S2 whose first input is coupled to the data input 3 in order to supply the channel word CH and whose second input comprises an output signal from the summator S2 fed back to it via a delay element D1. The output of the summator S2 is also coupled to a first modulo element M1, whose output forms the integrator output 42 for outputting the integrator word IW.

The difference element S1 of FIG. 2 comprises, at the input, a summing element comprising a positive and a negative input for forming the difference between the counter word CW and the integrator word IW, whose output is coupled to a second modulo element M2. The difference element S1 also comprises an offset element OF, whose input is coupled to the output of the second modulo element M2. The offset element OF is used to apply an offset, which is dependent on the predetermined word length and, by way of example, can be supplied via an offset input 4, to the phase error word PW.

As described above, in one embodiment the modulo counter MC delivers the counter word CW, which is dependent on clock edges of the oscillator signal OSC, for example, and which has a range of values which is dependent on the predetermined word length. The modulo factors for the modulo operations in the first and second modulo elements M1, M2 are likewise dependent on the predetermined word length. Hence, the modulo elements M1, M2 feed back a respective input signal into the desired range of values.

Figure 3:
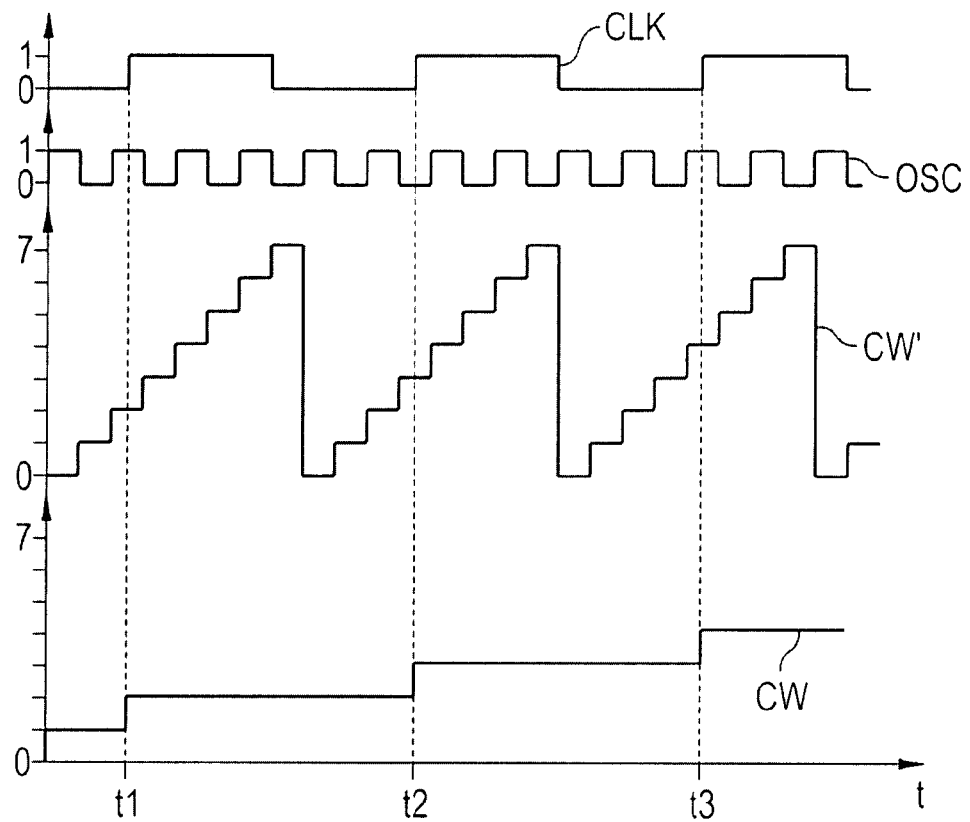
FIG. 3 shows a first exemplary signal/time diagram for signals in a phase/frequency detector.

FIG. 3 shows an exemplary signal timing diagram for possible signals arising in the modulo counter MC. The modulo counter MC is supplied with the oscillator signal OSC and the reference clock signal CLK. In this case, the oscillator signal OSC usually has a higher frequency, that is to say a larger number of clock edges, than the reference clock signal CLK. By way of example, the modulo counter MC counts the rising and falling clock edges of the oscillator signal OSC in an interim counting signal CW'. In this embodiment, the counter value of the interim counting signal CW' is increased by one upon every rising and every falling clock edge. By way of example, the modulo counter MC has a predetermined word length of 3 bits, so that the interim counting signal CW' can assume values from zero to seven. It follows from this that at a counter value of seven the next clock edge arising prompts a reset to the counter value zero. In this exemplary embodiment, the interim counting signal CW' thus overflows once during a reference clock period of the reference clock signal CLK. At a higher oscillator frequency of the oscillator signal OSC, the interim counting signals CW' may also overflow a plurality of times during a reference clock period.

The counter word CW is obtained from the interim counting signal CW' at the times t1, t2, t3 at which the reference clock signal CLK has a rising clock edge. In this exemplary embodiment, the counter word CW is also limited to the predetermined word length of 3 bits and hence a range of values from zero to seven. Although the overflows in the interim counting signal CW' or the counter word CW may restrict the range in which the modulo counter MC operates explicitly, the resolution of the modulo counter MC is not affected thereby. By way of example, the resolution of the modulo counter MC is dependent on the reference frequency of the reference signal CLK and the oscillator frequency of the oscillator signal OSC.

Figure 4:
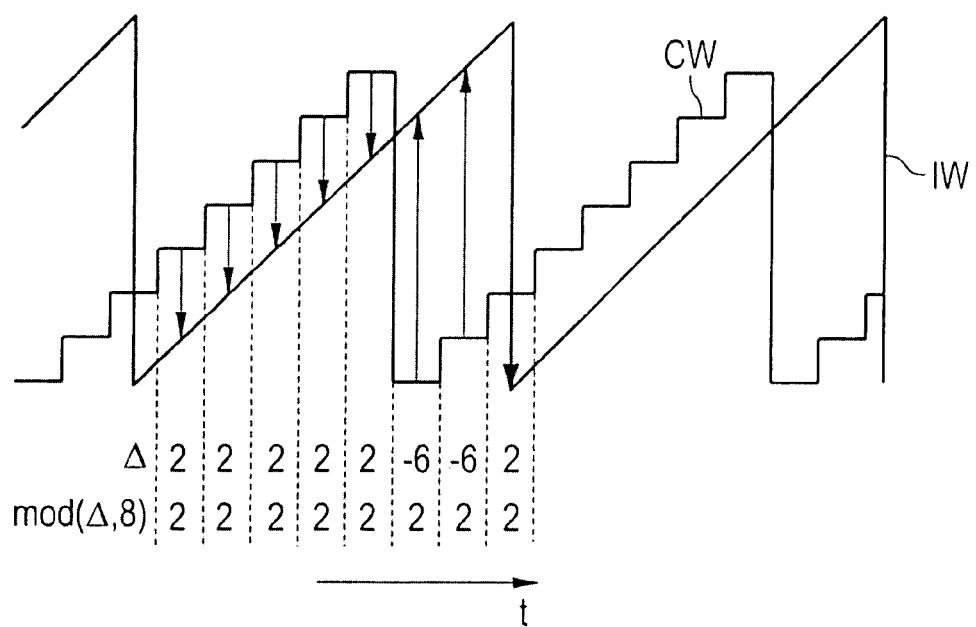
FIG. 4 shows a second exemplary signal/time diagram for signals in a phase/frequency detector.

FIG. 4 shows an exemplary signal timing diagram for signals in the phase/frequency detector PFD. This diagram depicts the waveform of the counter word CW, which an actual phase of the oscillator signal OSC, and of the integrator word IW, which embodies a nominal phase. Both the counter word CW and the integrator word IW have a sawtooth waveform which is obtained from the overflows in the modulo counter MC and in the modulo integrator MI. In this context, this exemplary embodiment again assumes a predetermined word length of 3 bits, which results in a modulo operator of 8 for the elements M1, M2.

In addition to the predetermined word length of three bits, for example, the integrator word IW may also have a fractional component, which is intended to be illustrated by the continuous waveform of the integrator word IW. However, the fractional component is not considered separately when ascertaining the phase error word PW and, by way of example, can be forwarded directly to a downstream loop filter LF. This can have a positive influence on the noise response of the phase locked loop.

FIG. 4 shows that the oscillator signal OSC has a frequency prescribed by the channel word CH, since the counter word CW and the integrator word IW exhibit the same gradient. However, the actual phase differs from the nominal phase, resulting in the difference $\Delta$ between the counter word CW and the integrator word IW. The overflow in the counter word CW and the integrator word IW means that both positive and negative differences $\Delta$ are obtained, so that a value of zero is obtained for the difference $\Delta$ on average over time. To take account of said overflows in the comparison signal $\Delta$, it is again possible to perform a modulo operation for the comparison signal $\Delta$, the modulo operator in this exemplary embodiment accordingly being chosen to be eight. This results in a constant phase difference of two which can be output as phase error word PW.

To be able to take account of both positive and negative phase differences, that is to say a lead and a lag in the actual phase over the nominal phase, the offset element OF shown in FIG. 2 can be used to deduct an average for the range of values from the comparison result, which in this exemplary embodiment would be obtained as four.

In another embodiment of the invention, the modulo elements M1, M2 in FIG. 2 can also be omitted if the summators used have a limited word length which corresponds to the predetermined word length, for example. A respective overflow in the summators in the modulo integrator MI and in the difference element S1 may comply with the function of the desired modulo operation. In addition, in one embodiment it is possible for the counter word CW, the integrator word IW and the phase error word PW to be represented in two's complement, which allows positive and negative phase errors to be handled more easily.

In another embodiment, the modulo element M2 and the offset element OF may be interchanged in the difference element S1, so that the modulo operation takes place after the offset is applied. In addition, it is also possible for the feedback in the modulo integrator to the summator S2 via the delay element D1 to be connected to the output of the modulo element M1.

On the basis of the phase error word PW, the oscillator signal OSC is adapted in the phase locked loop in order to reduce a phase error which arises. A phase error also arises when the frequency of the oscillator signal OSC differs from the frequency prescribed by the channel word CH. This frequency error can likewise be compensated for depending on the phase error word PW. However, larger frequency errors, which arise when a new frequency is set using an altered channel word CH, for example, may mean that the frequency error can be compensated for only slowly, that is to say that the phase locked loop cannot lock onto a new channel frequency quickly enough, or the phase locked loop cannot achieve a stable lock at all.

Figure 5A:
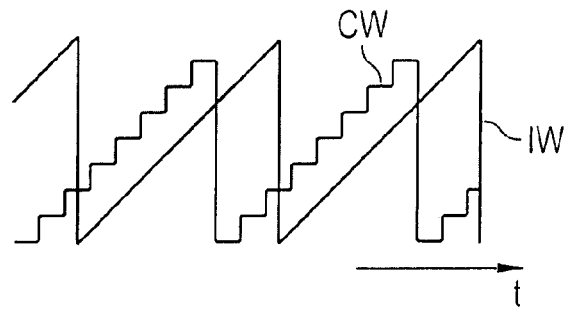
FIGS. 5A and 5B show a third and fourth exemplary signal/time diagram for signals in a phase/frequency detector.
Figure 5B:
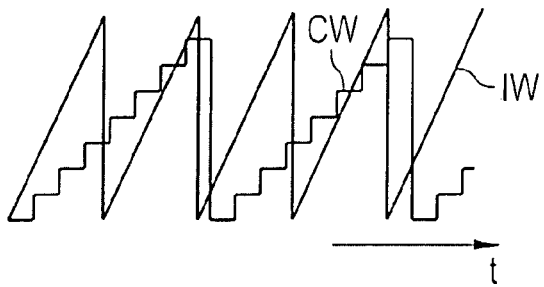

On the basis of the embodiments described above, the counter word CW and the integrator word IW overflow alternately in the modulo integrator MI and the modulo counter MC when the nominal frequency and the actual frequency match. This is shown again in an exemplary signal timing diagram in FIG. 5A for the purposes of illustration. In another exemplary signal timing diagram in FIG. 5B, the actual frequency, expressed by the counter word CW, has a lower value than the nominal frequency, which is represented by the integrator word IW. This means that the rise in the waveform of the integrator word IW is steeper than the corresponding rise in the counter word CW. As can be seen from FIG. 5B, an overflow in the integrator word IW accordingly occurs more often than an overflow in the counter word CW. In other words, with a distinct frequency error, a respective one of the counters for the integrator word IW and the counter word CW accordingly overflows more often than the other one.

Figure 6:
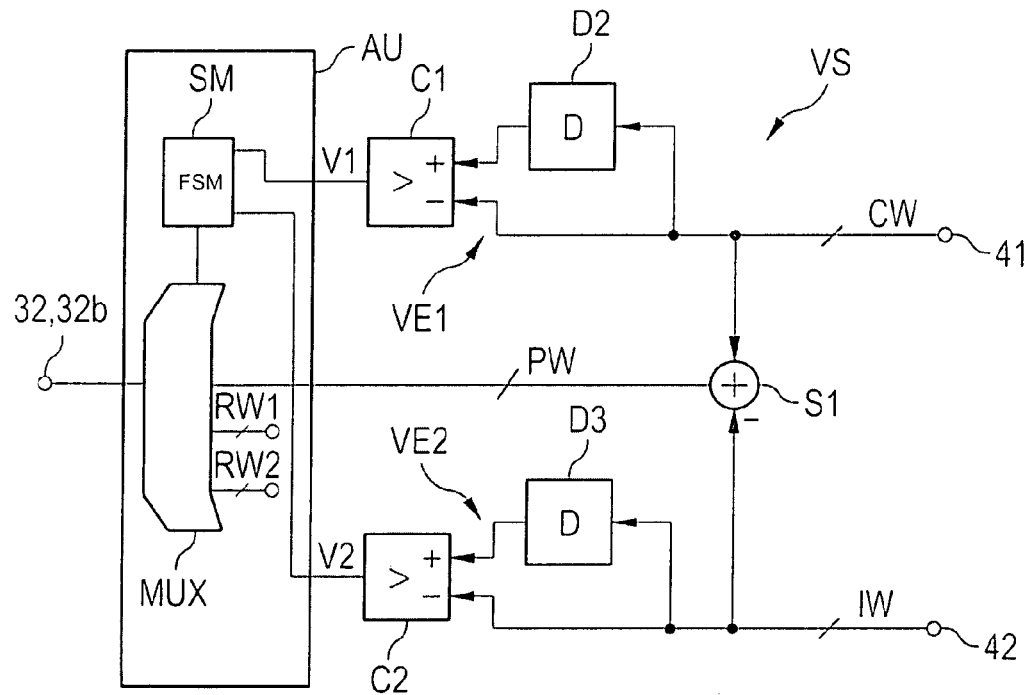
FIG. 6 shows a first exemplary embodiment of a comparison circuit.

FIG. 6 shows an exemplary embodiment of a comparison circuit VS which is used to evaluate an overflow in the counter word CW and in the integrator word IW. In this case, the comparison circuit VS comprises a first comparison element C1 having a first input (−), which is coupled to the output 41 of the modulo counter MC, and a second input (+), which is coupled via a delay element D2 to the connection 41 for supplying the counter word CW. In addition, the difference element S1 in this exemplary embodiment is contained in the comparison circuit VS.

The comparison circuit VS also comprises a second comparison element C2, whose inputs (+, −) are coupled directly or via a delay element D3 to the integrator output 42 for supplying the integrator word IW. In addition, an evaluation circuit AU is provided which comprises a finite state machine SM whose inputs are coupled to the outputs of the first and second comparison circuits C1, C2. The evaluation circuit also comprises a selection device MUX whose inputs have the phase error word PW, a first reference word RW1 and a second reference word RW2 applied to them. One of the three signals is selected for output at the output 32, 32b depending on control by the finite state machine SM.

In other words, the comparison circuit VS is set up to output the phase error word PW, the first reference word RW1 or the second reference word RW2 depending on the counter word CW and the integrator word IW.

To this end, the first comparison element C1 and the delay element D2 form a first comparison device VE1, and the second comparison element C2 and the delay element D3 form a second comparison device VE2. The first and second comparison devices VE1, VE2 compare a current value for the counter word CW or the integrator word IW with a respective chronologically preceding value. If the chronologically preceding value is greater than the current value then it may be assumed that an overflow has occurred in the respective signal CW or IW. Hence, the comparison elements C1, C2 generate a first and a second comparison signal V1, V2 depending on a comparison between chronologically successive values of the counter word CW or the integrator word IW.

The first and second comparison signals V1, V2 are supplied to the finite state machine SM in the evaluation circuit AU, where they are evaluated in order to actuate the selection circuit MUX to output the phase error word PW, the first reference word RW1 or the second reference word RW2.

If, by way of example, the comparison signals V1, V2 comprise the information that the counter word CW and the integrator word IW are overflowing alternately, the output of the evaluation circuit AU can output the phase error word PW, which is supposed to prompt pure phase adaptation, for example. In another instance, the comparison signals V1, V2 may comprise the information that the integrator word IW is overflowing more often than the counter word CW, which means that the frequency of the oscillator signal OSC is lower than the nominal frequency prescribed by the channel word CH, for example. In this case, the first reference word RW1, which, by way of example, corresponds to a maximum value for the range of values and hence is supposed to result in a significant change in the frequency of the oscillator signal in a positive direction, may be output at the output 32, for example. In a third case, for which the frequency of the oscillator signal OSC is higher than the nominal frequency, the second reference word RW2, which, by way of example, corresponds to a minimum value in the range of values in order to prompt a significant change in the frequency of the oscillator signal OSC in the opposite direction, may accordingly be output.

By way of example, the comparison devices VE1, VE2 generate a respective signal pulse in the comparison signals V1, V2 when an overflow in the relevant input signal CW, IW is detected. In the evaluation circuit AU or in the finite state machine SM, the number or sequence of signal pulses in the first and in the second comparison signal V1, V2 may be evaluated, for example. By way of example, the first reference word RW1 is output when in a particular period a number of signal pulses in the first comparison signal V1 is less than the number of signal pulses in the second comparison signal V2. The second reference word RW2 is output when in the particular period the number of signal pulses in the first comparison signal V1 is greater than the number of signal pulses in the second comparison signal V2. The phase error word PW is output when in the in the particular period the number of signal pulses in the first comparison signal V1 is equal to the number of signal pulses in the second comparison signal V2, that is to say that overflows occur alternately.

Figure 7:
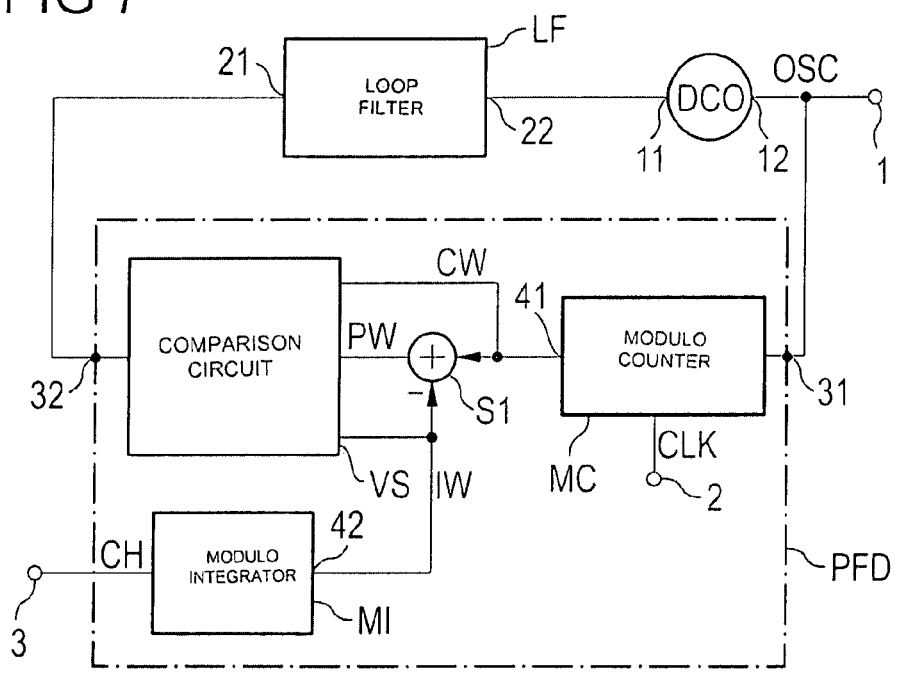
FIG. 7 shows a second exemplary embodiment of a phase locked loop.

FIG. 7 shows another exemplary embodiment of a phase locked loop with a phase/frequency detector PFD. In this arrangement, the phase/frequency detector PFD comprises the modulo counter MC, the modulo integrator MI and the comparison circuit VS, whose inputs are coupled to the integrator output 42, to the output 41 of the modulo counter MC and to the output of the difference element S1. By way of example, the comparison circuit VS is designed as in the exemplary embodiment shown in FIG. 6. Hence it is possible to compensate for both phase errors and significant frequency errors between the oscillator signal OSC and the nominal frequency determined by the channel word CH.

Figure 8:
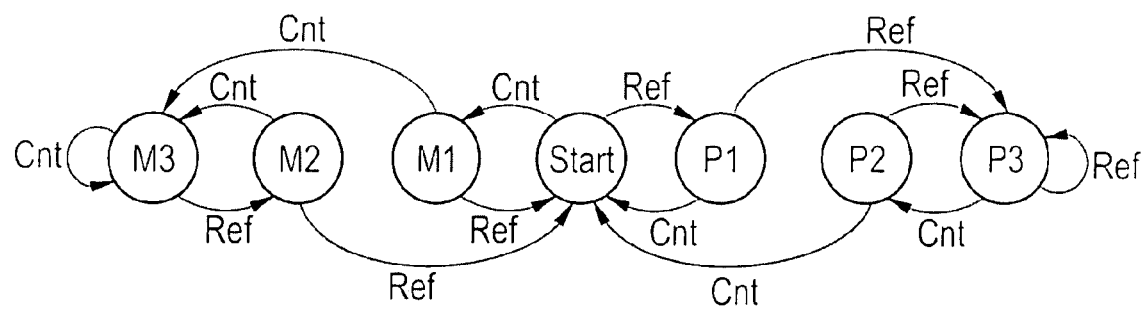
FIG. 8 shows a first exemplary state diagram in a comparison circuit.

FIG. 8 shows an exemplary state diagram which describes a function of the comparison circuit VS or of the finite state machine SM. In this case, an initial state Start and states P1, P2, P3 and M1, M2, M3 are provided. A transition between the states occurs depending on overflows in the counter word CW or in the integrator word IW. By way of example, a state transition Ref occurs when an overflow occurs in the integrator word IW, and a state transition Cnt occurs when an overflow occurs in the counter word CW. By way of example, the state transitions occur depending on signal pulses in the first and in the second comparison signal V1, V2.

Provision is made that in the states Start, M1 and P1 the respective phase error word PW is output in the comparison circuit VS as the difference between the counter word CW and the integrator word IW. When the oscillator signal OSC is at a frequency which corresponds to the nominal frequency, the counter word CW and the integrator word IW usually overflow alternately in each case. Starting from the initial state Start, changes to and fro therefore take place between the initial state Start and the state P1 or between the initial state Start and the state M1, resulting in permanent output of the phase error word PW.

If the frequency of the oscillator signal OSC is too low and as a result the integrator word IW overflows several times in succession without the counter word CW overflowing, however, there is a change to the state P3.

If individual overflows in the counter word CW occur in the interim, there is a transition to the state P2. To adapt the frequency of the oscillator signal OSC accordingly, the comparison circuit can, in states P2 and P3, output the first reference word RW1, which is supposed to increase the oscillator frequency, for example. Only when the desired frequency is reached or slightly exceeded is there a return to the initial state Start when two successive overflows in the counter word CW occur.

If the frequency of the oscillator signal OSC is greater than the nominal frequency, however, a plurality of overflows in the counter word CW occur in succession, resulting in a change to the state M3. In similar fashion to the principle described above, there is a change between the states M2 and M3 for overflows in the integrator word IW which occur in the interim in this case too. In this case, the output of the comparison circuit VS can output the second reference word RW2, which is supposed to lower the oscillator frequency, for the states M2 and M3. A return to the initial state Start takes place again when two overflows in the integrator word IW occur, which is equivalent to the desired nominal frequency being reached or undershot, for example.

When clock edges of the oscillator signal OSC are being counted or when the channel word CH is being integrated, the modulo factor obtained from the predetermined word length may mean that at certain frequencies it is not possible to detect an overflow in the integrator word IW or in the counter word CW, for example because the integrator word IW has a constant value. Assuming that the predetermined word length is four bits, this results in a modulo factor of 16, that is to say that, by way of example, the summator in the modulo integrator MI overflows at a value of 16. If the desired frequency is 8320 MHz and the frequency of the reference clock signal CLK is 208 MHz, for example, counting rising and falling clock edges in the oscillator signal OSC results in a channel word of $$2 \cdot \left(\frac{8320}{208}\right) = 80.$$

If this channel word is integrated with a word length of four bits, the reference phase obtained is thus always the value zero or another constant value which is dependent on initial conditions. Hence, no overflows with the remainder occur which can be detected in the comparison circuit VS, which can ultimately result in an undefined state in the finite state machine SM.

This problem can be overcome in one embodiment by increasing the clock frequency of the reference clock signal CLK, for example. Alternatively, a greater predetermined word length may be provided for the modulo counter MC and the modulo integrator MI. However, such measures are usually associated with increased power consumption and with increased implementation complexity.

In one alternative embodiment, the word length is not increased fully in the modulo integrator MI and in the modulo counter MC. In other words, the predetermined word length is retained with the integrator word IW and the counter word CW, and in the modulo integrator MI and the modulo counter MC one or more bits are additionally provided internally which indicate an overflow. For the numerical example shown above, this would require just one additional bit, which in this case has a significance of 32 and hence is able to respectively detect and indicate an overflow.

Figure 9A:
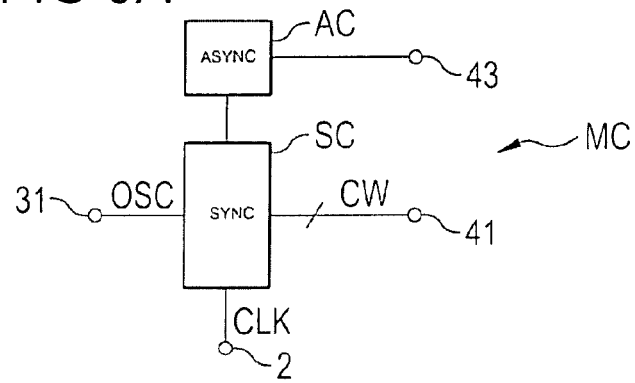
FIG. 9A shows an exemplary embodiment of a modulo counter.

FIG. 9A shows an exemplary embodiment of a modulo counter MC expanded depending on this principle. The modulo counter MC comprises a first counting element SC which has the predetermined word length and whose output 41 outputs the counter word CW for further processing. In addition, a further counting element AC is provided which is coupled to the counting element SC and which is actuated depending on the counting operation.

By way of example, the counting element SC is formed by a synchronous counter with the predetermined sword length. The additional counting element AC may be in the form of an asynchronous counting element, for example in the form of an edge-triggered flipflop, which is actuated by the most significant bit MSB of the counting element SC. In this case, the additional counting element AC may be in the form of a single-bit or multibit counter. The output 43 of the modulo counter MC shown outputs the most significant bit of the additional counting element AC. If the additional counting element AC is in the form of a single-bit counter, the most significant bit is the single counting bit.

Figure 9B:
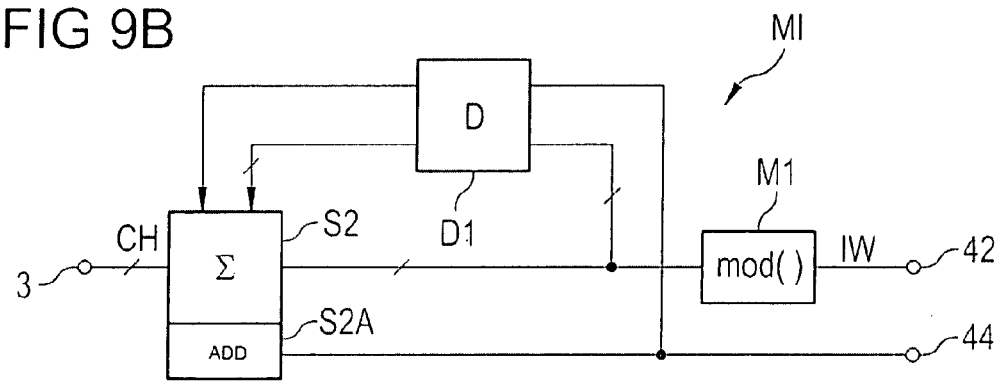
FIG. 9B shows an exemplary embodiment of a modulo integrator.

FIG. 9B shows an exemplary embodiment of an expanded modulo integrator MI in which, in addition to the summing element S2, an additional adding element S2a is provided. In this case, an integrated value with the predetermined word length can be tapped off at the output of the adding element S2, while an additional more significant bit is provided for the addition operation at the output of the additional adding element S2a. Both the output of the adding element S2 and the output of the additional adding element S2a are fed back via the delay element D1 for the integration operation.

The additional adding element S2a may also be provided for a larger number of additional adding bits. The integrator output 42 again outputs the integrator word IW following a modulo operation with the modulo element M1. At the additional output 44, it is possible to tap off the output signal from the additional adding element S2a which is in turn more significant than the bits of the integrator word IW and can therefore signal an overflow during the integration.

Figure 10:
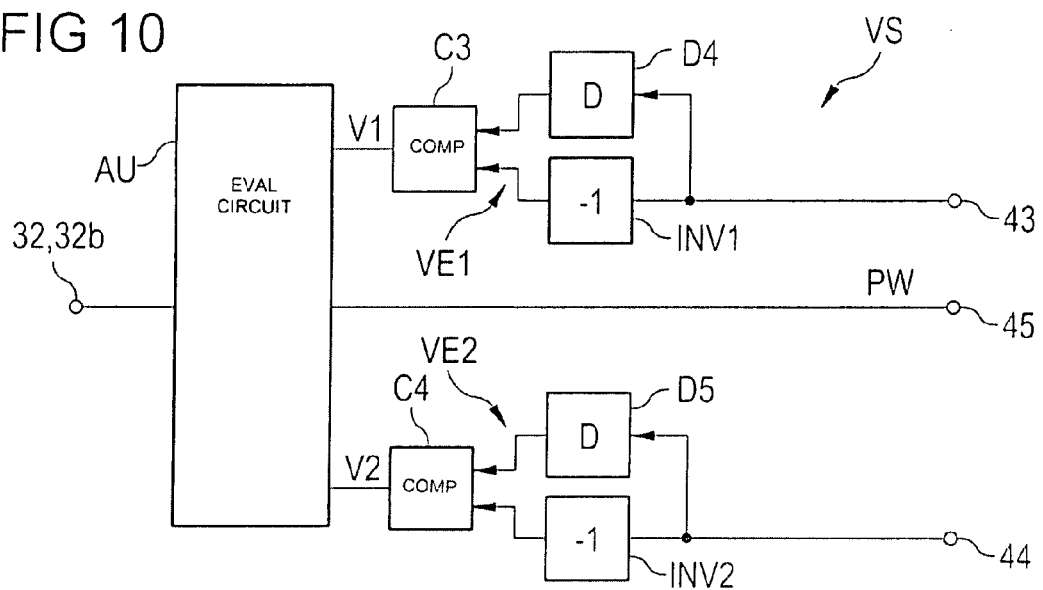
FIG. 10 shows a second exemplary embodiment of a comparison circuit.

FIG. 10 shows a further embodiment of a comparison circuit VS. In this arrangement, the evaluation circuit AU is coupled to a connection 45 for supplying the phase error word PW, which has the predetermined word length. The first comparison device VE1 comprises a comparison element C3, a delay element D4 and an inverter INV1, whose inputs are coupled to the output 43 of the modulo counter MC. In similar fashion, the second comparison device VE2 comprises the comparison element C4, the delay element D5 and the inverter INV2, which are connected to the output 44 of the modulo integrator MI. By way of example, the comparison elements C3, C4 may be in the form of AND gates or in the form of coincidence gates.

The comparison devices VE1, VE2 can detect signal edges in the respective input signals from the modulo counter MC or the modulo integrator MI. In this case, the clock edges correspond to a change in the most significant bit during the counting operation or during the integration. On the basis of the detection of the overflows in the modulo counter MC and the modulo integrator MI, signal pulses can again be generated in the first and second comparison signals V1, V2, for example. These can be evaluated in the evaluation circuit AU, for example in a finite state machine SM (not shown here). The output 32, 32b of the comparison circuit therefore outputs either the phase error word PW, the first reference word RW1 or the second reference word RW2 depending on the comparison signals V1, V2.

In other words, the signal at the output 43 of the modulo counter MC is a first overflow signal, whose value is dependent on an overflow in the counter word CW or on a reset during the counting operation for the clock edges of the oscillator signal OSC. In similar fashion, the signal which is output by the modulo integrator MI at the output 44 corresponds to a second overflow signal, whose value is dependent on the modulo operation with the integrator word IW or an internal overflow in the adding element S2. In the exemplary embodiment of the comparison circuit VS which is shown in FIG. 10, it is thus possible for signal pulses to be generated in the first and second comparison signals V1, V2 as a function of the first or second overflow signal, for example.

Figure 11:
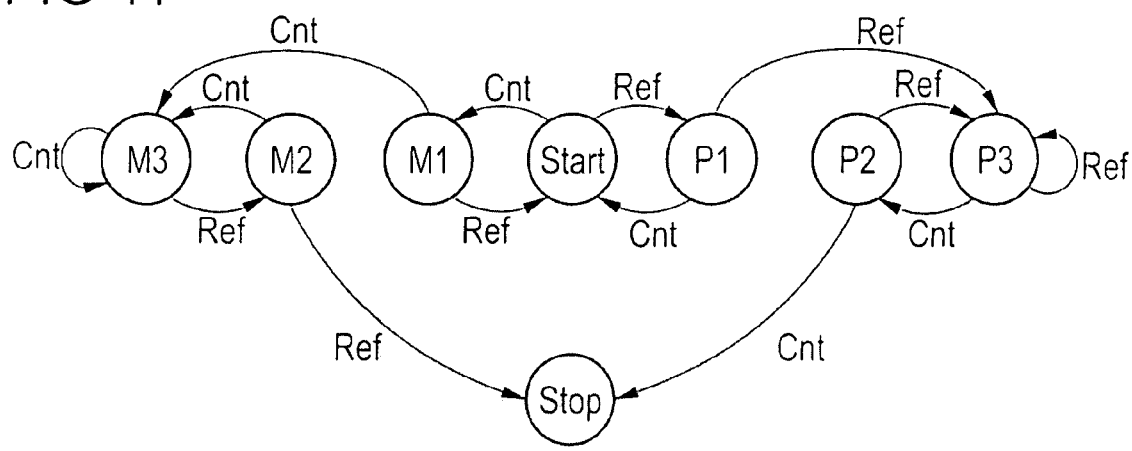
FIG. 11 shows a second exemplary state diagram in a comparison circuit.

FIG. 11 shows a further exemplary state diagram, for example for a decision logic unit in the evaluation circuit AU. In this case, the function may again be implemented in a finite state machine SM. The states essentially correspond to the function of the state diagram shown in FIG. 8. In the event of an overflow in the counter word CW, however, there is a transition from the state P2 to a final state Stop, in which the output 32, 32b of the comparison circuit VS outputs the phase error word PW. Similarly, the occurrence of an overflow in the integrator word IW in state M2 prompts a transition to the final state Stop.

The final state Stop is therefore a state of the phase locked loop in which the frequency of the oscillator signal OSC essentially corresponds to the desired nominal frequency and the phase/frequency detector PFD detects only phase errors. In this case, it is also possible to refer to a locked state of the phase locked loop. In addition, the final state Stop can prevent unwanted state changes from being brought about by interfering influences, for example on account of noise, which result in unwanted signal pulses in the comparison signals V1, V2. By way of example, it is thus possible to prevent interfering influences from causing a change to the states M3 and P3, which would result in an unwanted frequency change in the phase locked loop.

A finite state machine with the manner of operation shown in FIG. 11 remains in the final state Stop when it is reached and should be put into the initial state Start by an additional signal for a new frequency detection operation. By way of example, this can be done when setting a new channel frequency by applying a new channel word CH, so that the phase/frequency detector PFD can detect a frequency error which then occurs.

Table 1 once again shows the dependency regarding which signal from the set comprising the phase error word PW, the first reference word RW1 and the second reference word RW2 is output for which state.

TABLE 1

| State | Output word from the comparison circuit VS |
|---|---|
| Start | Phase error word PW |
| P1 | Phase error word PW |
| P2 | First reference word RW1 |
| P3 | First reference word RW1 |
| M1 | Phase error word PW |
| M2 | Second reference word RW2 |
| M3 | Second reference word RW2 |
| Stop | Phase error word PW |

Figure 12:
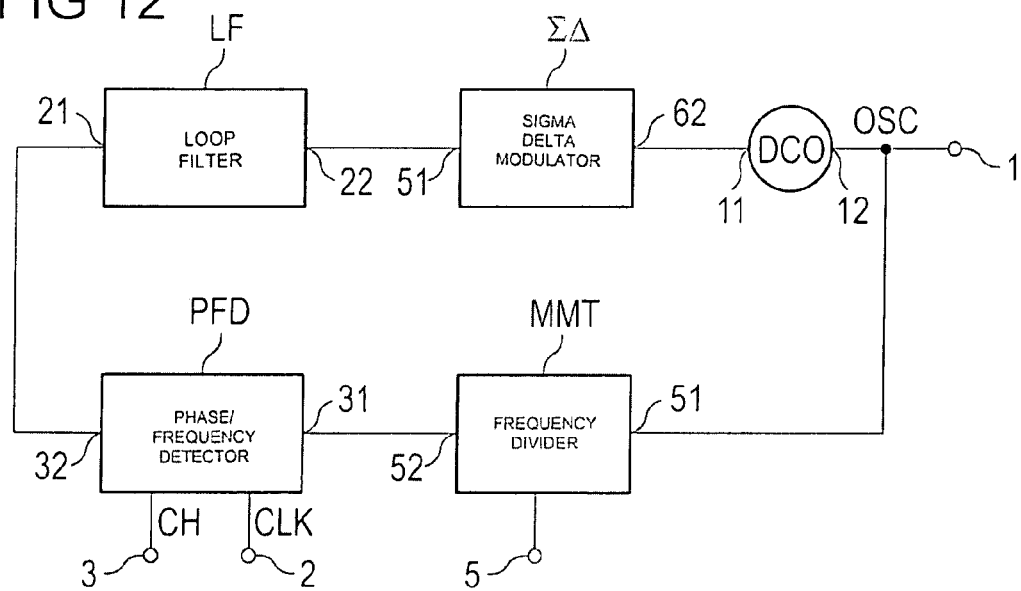
FIG. 12 shows a third exemplary embodiment of a phase locked loop.

FIG. 12 shows a further exemplary embodiment of a phase locked loop. In addition to the exemplary embodiments of a phase locked loop shown previously, this embodiment has a sigma-delta modulator $\Sigma\Delta$ between the output 22 of the loop filter LF and the oscillator input 11 of the controlled oscillator DCO. The filtered phase error word can therefore be oversampled and noise-shaped.

In addition, a frequency divider MMT is provided whose input 51 is coupled to the oscillator output 12. An output 52 of the frequency divider MMT is connected to the input 31 of the phase/frequency detector PFD or the modulo counter MC contained therein. By way of example, the frequency divider MMT is in the form of a multimodulus divider with an adjustable divider ratio, which can be supplied via a control input 5. The phase/frequency detector PFD or the modulo counter MC is therefore not supplied with the oscillator signal OSC directly but rather is supplied with a frequency-divided signal derived from the oscillator signal OSC.

On the basis of the embodiments described, phase and frequency detection can be implemented with little complexity in a phase locked loop. Since the phase/frequency detector PFD is of differentiator-free design, it is also possible to dispense with integrating elements in a downstream loop filter which would cancel differentiation. The phase/frequency detector PFD can be designed with a short word length, which in turn results in reduced implementation complexity. A level of accuracy for the phase/frequency detector PFD is not adversely affected by the short word length, however.

In one of the embodiments shown, the phase/frequency detector PFD can be used in a phase locked loop in a mobile communication appliance or in another radio-frequency transmission system, for example.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

The invention claimed is:

1. A phase/frequency detector, comprising:
   a modulo counter configured to output a counter word having a predetermined word length based on an oscillator signal;
   a modulo integrator configured to output an integrator word having the predetermined word length as a function of an integration of a channel word; and
   a difference element configured to output a phase error word with the predetermined word length as a function of a difference between the counter word and the integrator word.

2. The phase/frequency detector of claim 1, wherein the modulo counter outputs the counter word in clocked fashion based on a reference clock signal.

3. The phase/frequency detector of claim 1, wherein the difference element comprises a modulo element configured to perform a modulo operation on a difference word associated with the counter word and the integrator word, wherein the difference word has the predetermined word length.

4. The phase/frequency detector of claim 1, wherein the difference element comprises an offset element configured to apply an offset to the difference between the counter word and the integrator word to generate the phase error word, wherein the offset is dependent on the predetermined word length.

5. The phase/frequency detector of claim 1, the difference element further comprising a comparison circuit configured to output the phase error word, a first reference word or a second reference word based on the counter word and the integrator word.

6. The phase/frequency detector of claim 5, wherein the comparison circuit comprises:
   a first comparison element configured to generate a first comparison signal based on a comparison between chronologically successive values of a signal derived from the counter word;
   a second comparison element configured to generate a second comparison signal based on a comparison between chronologically successive values of a signal derived from the integrator word; and
   an evaluation circuit configured to output the phase error word, the first reference word or the second reference word based on the first and second comparison signals.

7. The phase/frequency detector of claim 6, wherein the evaluation circuit is configured to:
   output the first reference word if in a predetermined time period a number of signal pulses in the first comparison signal is less than a number of signal pulses in the second comparison signal;
   output the second reference word if in the predetermined time period the number of signal pulses in the first comparison signal is greater than the number of signal pulses in the second comparison signal; or
   output the phase error word if in the predetermined time period the number of signal pulses in the first comparison signal is equal to the number of signal pulses in the second comparison signal.

8. The phase/frequency detector of claim 7, wherein the first and second comparison elements generate the signal pulses in the first and second comparison signals based on an overflow in the counter word or the integrator word.

9. The phase/frequency detector of claim 7, wherein the modulo counter comprises at least one additional counting element configured to actuate based on the counter word, and wherein the modulo integrator comprises at least one additional adding element configured to actuate based on the integrator word, wherein the first and second comparison elements generate the signal pulses based on a respective output signal from the at least one additional counting element and from the at least one additional adding element.

10. A phase locked loop, comprising:
    a controlled oscillator configured to output for outputting an oscillator signal at an output, and comprising an oscillator input;
    a loop filter, comprising a filter input and a filter output that is coupled to the oscillator input; and
    a phase/frequency detector comprising:
       a modulo counter configured to output a counter word having a predetermined word length based on the oscillator signal;
       a modulo integrator configured to output an integrator word having the predetermined word length as a function of an integration of a channel word; and
       a difference element comprising an output coupled to the filter input, wherein the difference element is configured to output a phase error word with the predetermined word length as a function of a difference between the counter word and the integrator word.

11. The phase locked loop of claim 10, wherein the loop filter output is coupled to the oscillator input via a sigma-delta modulator.

12. The phase locked loop of claim 10, wherein the oscillator output is coupled to the modulo counter via a frequency divider.

13. A method for phase/frequency detection, comprising:
    deriving a counter word based on a number of clock edges of an oscillator signal and a predetermined range value;
    deriving an integrator word by integrating a channel word;
    executing a modulo operation with the integrator word as a function of the range value;
    deriving a phase error word by forming a difference between the counter word and the integrator word; and
    executing a modulo operation with the phase error word as a function of the range value.

14. The method of claim 13, wherein the derivation of the counter word comprises:
    increasing a counter value based on the number clock edges of the oscillator signal;
    resetting the counter value if the range value is exceeded by the counter value; and
    deriving the counter word from the counter value based on a reference clock signal.

15. The method of claim 13, wherein the phase error word comprises an offset applied to it which is dependent on the range value.

16. The method of claim 13, further comprising outputting the phase error word, or a first reference word, or a second reference word based on the counter word and the integrator word.

17. The method of claim 16, wherein the selective outputting comprises:
    generating a first comparison signal based on a comparison between chronologically successive values of a signal derived from the counter word;
    generating a second comparison signal based on a comparison between chronologically successive values of a signal derived from the integrator word; and
    forwarding the phase error word or the first reference word or the second reference word based on the first and second comparison signals.

18. The method of claim 17, wherein the selective outputting further comprises:
forwarding the first reference word if in a predetermined time period a number of signal pulses in the first comparison signal is less than a number of signal pulses in the second comparison signal;
forwarding the second reference word if in the predetermined time period the number of signal pulses in the first comparison signal is greater than the number of signal pulses in the second comparison signal; or
forwarding the phase error word if in the predetermined time period the number of signal pulses in the first comparison signal is equal to the number of signal pulses in the second comparison signal.

19. The method of claim 18, wherein the signal pulses in the first and second comparison signals are generated based on an overflow in the counter word and in the integrator word, respectively.

20. The method of claim 18, wherein a first overflow signal, whose value is dependent on a reset, and a second overflow signal, whose value is dependent on the modulo operation with the integrator word, are generated, and wherein the signal pulses in the first and second comparison signals are generated as a function of the first and second overflow signals, respectively.

21. The method of claim 13, wherein the counter value is increased based on rising and falling clock edges of the oscillator signal.

22. A method for generating an oscillator signal, comprising:
generating the oscillator signal based on a control signal;
deriving a feedback signal from the oscillator signal;
deriving a counter word based on a number of clock edges of the feedback signal and a predetermined range value;
deriving an integrator word by integrating a channel word;
executing a modulo operation with the integrator word as a function of the range value;
deriving a phase error word by forming a difference between the counter word and the integrator word;
executing a modulo operation with the phase error word as a function of the range value;
filtering the phase error word; and
adapting the control signal based on the filtered phase error word.

23. The method of claim 22, wherein adapting the control signal comprises sigma-delta modulation of the filtered phase error word.

24. The method of claim 22, wherein deriving the feedback signal comprises a frequency division of the oscillator signal.

25. A mobile communication appliance comprising a phase/frequency detector, comprising:
a modulo counter configured to output a counter word having a predetermined word length based on an oscillator signal;
a modulo integrator configured to output an integrator word with the predetermined word length as a function of an integration of a channel word; and
a difference element configured to output a phase error word with the predetermined word length as a function of a difference between the counter word and the integrator word.

* * * * *